US006611543B2

(12) United States Patent
Hwang

(10) Patent No.: US 6,611,543 B2
(45) Date of Patent: Aug. 26, 2003

(54) VERTICAL-CAVITY SURFACE-EMITTING LASER WITH METAL MIRROR AND METHOD OF FABRICATION OF SAME

(75) Inventor: Wen-Yen Hwang, Sugar Land, TX (US)

(73) Assignee: Applied Optoelectronics, Inc., Sugar Land, TX (US)

(*) Notice: Subject to any disclaimer, the term of this patent is extended or adjusted under 35 U.S.C. 154(b) by 0 days.

(21) Appl. No.: 10/002,994

(22) Filed: Nov. 30, 2001

(65) Prior Publication Data

US 2002/0080836 A1 Jun. 27, 2002

Related U.S. Application Data

(60) Provisional application No. 60/257,881, filed on Dec. 23, 2000.

(51) Int. Cl.[7] .................................................. H01S 3/19
(52) U.S. Cl. .......................................... 372/45; 372/43
(58) Field of Search ............................... 372/45, 44, 98, 372/50

(56) References Cited

U.S. PATENT DOCUMENTS

| 5,164,949 A | * 11/1992 | Ackley et al. ................. 372/45 |
| 5,295,147 A | * 3/1994 | Jewell et al. .................. 372/45 |
| 5,468,656 A | * 11/1995 | Shieh et al. .................. 438/32 |
| 5,568,499 A | * 10/1996 | Lear ............................. 372/45 |
| 5,574,738 A | * 11/1996 | Morgan ......................... 372/28 |
| 5,638,392 A | * 6/1997 | Ramdani et al. .............. 372/45 |
| 5,748,665 A | * 5/1998 | Jiang et al. ................... 372/96 |
| 5,901,168 A | 5/1999 | Baillargeon et al. |
| 5,978,401 A | * 11/1999 | Morgan ......................... 372/50 |
| 5,985,686 A | * 11/1999 | Jayaraman ..................... 438/32 |

OTHER PUBLICATIONS

MacDougal et al., "Electrically–Pumped Vertical–Cavity Lasers with A1O–GaAs Reflectors," *IEEE Photonics Technology Letters*, vol. 8, No. 3, Mar. 1996, pp. 310–312.

* cited by examiner

*Primary Examiner*—Paul Ip
*Assistant Examiner*—Dung T Nguyen
(74) *Attorney, Agent, or Firm*—N. Stephan Kinsella; Conley Rose, P.C.; Gentry E. Crook

(57) ABSTRACT

A vertical-cavity surface-emitting laser (VCSEL) structure has a semiconductor bottom distributed Bragg reflector (DBR) arranged over a substrate; a metal mirror layer interposed between the bottom DBR and the substrate, wherein the metal mirror layer and bottom DBR are adapted to form a first mirror of the laser structure; and a reaction barrier layer interposed between the metal mirror layer and the bottom DBR, wherein the reaction barrier layer is adapted to reduce reaction between the metal mirror layer and the bottom DBR. A phase matching layer is interposed between the reaction barrier layer and the bottom DBR to adjust the phase of radiation reflected by the metal mirror layer such that an increased overall reflectance is obtained. The VCSEL is fabricated by bonding a first metal bonding layer formed over the bottom DBR and a metal mirror layer on a first substrate to a second metal bonding layer formed on a second substrate.

18 Claims, 7 Drawing Sheets

VERTICAL-CAVITY SURFACE-EMITTING LASER WITH METAL MIRROR AND METHOD OF FABRICATION OF SAME

CROSS-REFERENCES TO RELATED APPLICATIONS

This nonprovisional U.S. national application, filed under 35 U.S.C. §111(a), claims, under 37 C.F.R. §1.78(a)(3), the benefit of the filing date of provisional U.S. national application No. 60/257,881, filed under 35 U.S.C. §111(b) and accorded a filing date of Dec. 23, 2000, the entirety of which is incorporated herein by reference.

This application is related to the U.S. Patent Application entitled "Vertical-Cavity Surface-Emitting Laser with Bottom Dielectric Distributed Bragg Reflector," filed on even date herewith (Nov. 30, 2001), inventors Wen-Yen Hwang et al., assignee Applied Optoelectronics, Inc., the entirety of which is incorporated herein by reference.

BACKGROUND OF THE INVENTION

1. Field of the Invention

This invention relates generally to sources of electromagnetic laser radiation by semiconductor lasers and, in particular, to vertical cavity surface emitting lasers (VCSELs) and methods for fabricating same.

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors, one of which serves as the "exit" mirror. When the active region is pumped with an appropriate pumping energy, it produces photons, some of which resonate and build up to form coherent light in the resonant cavity formed by the two mirrors. A portion of the coherent light built up in the resonating cavity formed by the active region and top and bottom mirrors passes through one of the mirrors (the exit mirror) as the output laser beam.

Various forms of pumping energy may be utilized to cause the active region to begin to emit photons. For example, semiconductor lasers of various types may be electrically pumped (EP) (by a DC or alternating current), or pumped in other ways, such as by optical pumping (OP) or electron beam pumping. EP semiconductor lasers are typically powered by applying an electrical potential difference across the active region, which causes a current to flow therein. As a result of the potential applied, charge carriers (electrons and holes) are injected from opposite directions into an active region where recombination of electron and holes occurs. There are two kinds of recombination events, i.e. radiative and non-radiative, concurrently happening in the active region. When radiative recombination occurs, a photon is emitted with the same energy as the difference in energy between the hole and electron energy states. Some of those photons travel in a direction perpendicular to the reflectors of the laser. As a result of the ensuing reflections, the photons can travel through the active region multiple times.

Stimulated emission occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon will have the same energy and frequency as the original photon, and will also be in phase with the original photon. Thus, when the photons produced by spontaneous electron transition interact with other high energy state electrons, stimulated emission can occur so that two photons with identical characteristics are present. (Viewed as waves, the atom emits a wave having twice the amplitude as that of the original photon interacting with the atom.) If a sufficient amount of radiative recombinations are stimulated by photons, the number of photons traveling between the reflectors tends to increase, giving rise to amplification of light and lasing. The result is that coherent light builds up in the resonant cavity formed by the two mirrors, a portion of which passes through the exit mirror as the output laser beam.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror. The exit mirror typically has slightly lower reflectance (i.e., reflectivity) than the other mirror.

VCSELs have many attractive features compared to edge-emitting lasers, such as low threshold current, single longitudinal mode, a circular output beam profile, and scalability to monolithic laser arrays. The shorter cavity resonator of the VCSEL provides for better longitudinal mode selectivity, and hence narrower linewidths. Additionally, because the output is perpendicular to the wafer surface, it is possible to test fabricated VCSELs on the wafer before extensive packaging is done, in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active region sandwiched between two mirrors, such as distributed Bragg reflector (DBR) mirrors. Both EP and OP VCSEL designs are possible. The two mirrors may be referred to as a top DBR and a bottom DBR. Because the optical gain is low in a vertical cavity design, the reflectors require a high reflectance in order to achieve a sufficient level of feedback for the device to lase. DBRs are typically formed of multiple pairs of layers referred to as mirror pairs; DBRs are sometimes referred to as mirror stacks. The DBR mirrors of a typical VCSEL can be constructed from dielectric (insulating) or semiconductor layers (or a combination of both, including metal mirror sections). The pairs of layers are formed of a material system generally consisting of two materials having different indices of refraction; for semiconductor DBRs, the layers are typically selected so that they are easily lattice matched to the other portions of the VCSEL, to permit epitaxial fabrication techniques.

When properly designed, these mirror pairs will cause a desired reflectance at the lasing wavelength, at which wavelength the active region is also designed to have sufficient gain to permit lasing to occur. Typically in a VCSEL, the mirrors are designed so that the bottom DBR mirror (i.e. the one interposed between the substrate material and the active region) has nearly 100% reflectance, while the top (exit) DBR mirror has a reflectance that may be 98%–99.5% (depending on the details of the laser design). The partially reflective top (exit) mirror passes a portion of the coherent light built up in the resonating cavity formed by the active region and top and bottom mirrors. In other designs, the bottom mirror may serve as the exit mirror and the top mirror has the higher reflectance.

For semiconductor DBRs, the number of mirror pairs per stack may range from 20–40 pairs to achieve a high percentage of reflectance, depending on the difference between the refractive indices of the layers. A larger number of mirror pairs increases the percentage of reflected light (reflectance). The difference between the refractive indices of the layers of the mirror pairs can be higher in dielectric DBRs, generally imparting higher reflectance to dielectric DBRs than to semiconductor DBRs for the same number of mirror pairs and overall thickness. Conversely, in a dielectric DBR, a smaller number of mirror pairs can achieve the same reflectance as a larger number in a semiconductor DBR. However, semiconductor DBRs, despite their lower reflectance/greater thickness, can be preferred because of comparative advantages in electrical conductivity, thermal conductivity, and manufacturability For example, in an EP VCSEL, a semiconductor DBR can be preferred, especially for the bottom DBR (between the substrate and active region), to conduct the pumping current through the active region, the bottom DBR, and into the substrate. Semiconductor DBRs may also be preferred for manufacturing reasons (e.g., it may be required if the initial epitaxial substrate is to be used for support) or fabrication reasons (e.g., an epitaxial, i.e. semiconductor, DBR may be needed if other epitaxial layers need to be grown on top of the DBR). Accordingly, there is often a tradeoff between using a lower reflectance, thicker semiconductor DBR, or a higher reflectance, thinner dielectric DBR which is more difficult to manufacture or which makes thermal conductivity more of an issue.

VCSEL technology and related matters are discussed in further detail in *Vertical-Cavity Surface-Emitting Lasers: Design, Fabrication, Characterization, and Applications*, eds. Carl W. Wilmsen, Henryk Temkin & Larry A. Coldren, Cambridge: Cambridge University Press (1999); U.S. Pat. No. 5,468,656, Shieh et al., "Method of Making a VCSEL"; U.S. Pat. No. 5,985,686, Jayaraman, "Process for Manufacturing Vertical Cavity Surface Emitting Lasers Using Patterned Wafer Fusion and the Device Manufactured by the Process"; and MacDougal et al., "Electrically-Pumped Vertical-Cavity Lasers with AlO-GaAs Reflectors", IEEE Photonics Letters, vol. 8, No. 3, March 1996.

It is desirable to employ long-wavelength VCSELs, e.g. those having emission in the infra-red spectrum (e.g., wavelengths longer than 1 $\mu$m (micron)), or other long-wavelength outputs such as 1.3 $\mu$m (i.e., 1310 nm) to 1.55 $\mu$m. Long wavelength (1.3 $\mu$m to 1.55 $\mu$m) VCSELs are also of great interest in the optical telecommunications industry because of the minimum fiber dispersion at 1.32 $\mu$m and the minimum fiber loss at 1.55 $\mu$m. The dispersion shifted fiber will have both minimum dispersion and minimum loss at 1.55 $\mu$m. Other long wavelength, infrared VCSELs can be employed in various medical applications.

The typical reflectance that is required for the bottom cavity mirror of a high performance VCSEL is more than 99.5%, especially for longer wavelength VCSELs which have lower gain compared to shorter wavelength ones (in general, where there is lower gain, higher cavity reflectance is needed). Long wavelength VCSELs are often based on an InP-based material system, e.g. an $In_xGa_{1-x}AS_yP_{1-y}$ active layer lattice matched to InP cladding layers. The semiconductor DBRs used in such VCSELs have to be lattice matched to the VCSEL's material system. Unfortunately, in the available (i.e., lattice matched) semiconductor DBR material systems for such VCSELs, there are typically very small difference in the refractive indices in this material system. This makes it difficult to achieve the desired reflectance, without employing a large number of mirror pairs, which leads to often unacceptably thicker DBRs. Moreover, the greater the operating (emitting) wavelength of the laser, the thicker each layer must be, further contributing to the increased thickness of long-wavelength semiconductor DBRs.

Long-wavelength VCSELs thus would require a comparatively thick semiconductor bottom DBR, which can be difficult to manufacture. Such thick DBRs can also have poor thermal conductivity, so that it is difficult to achieve adequate heat dispersion to the heat-spreading submount to which the bottom DBR is mounted. The formation of the thick semiconductor DBR on an InP substrate, for example, causes serious manufacturability and other problems, as described above.

Many attempts have been made to address this problem, including fabrication of devices that utilize wafer bonding techniques, but only limited success has been achieved. As an example, devices are currently utilized in which a semiconductor DBR mirror structure is epitaxially grown on a GaAs substrate. Next, the active layer is grown on the InP substrate. The two elements are then flip chip mounted together and fused using wafer fusion techniques. The end result is a device that is expensive to manufacture, and which exhibits low efficiency, low output power, and low yield. In addition, the interface defect density in the wafer fusion procedure causes potential reliability problems of the VCSEL end product.

There is, therefore, a need for improved VCSEL mirrors and methods for fabricating same. In particular, it is desirable to improve the reflectance of the bottom cavity mirrors for long-wavelength VCSELs.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
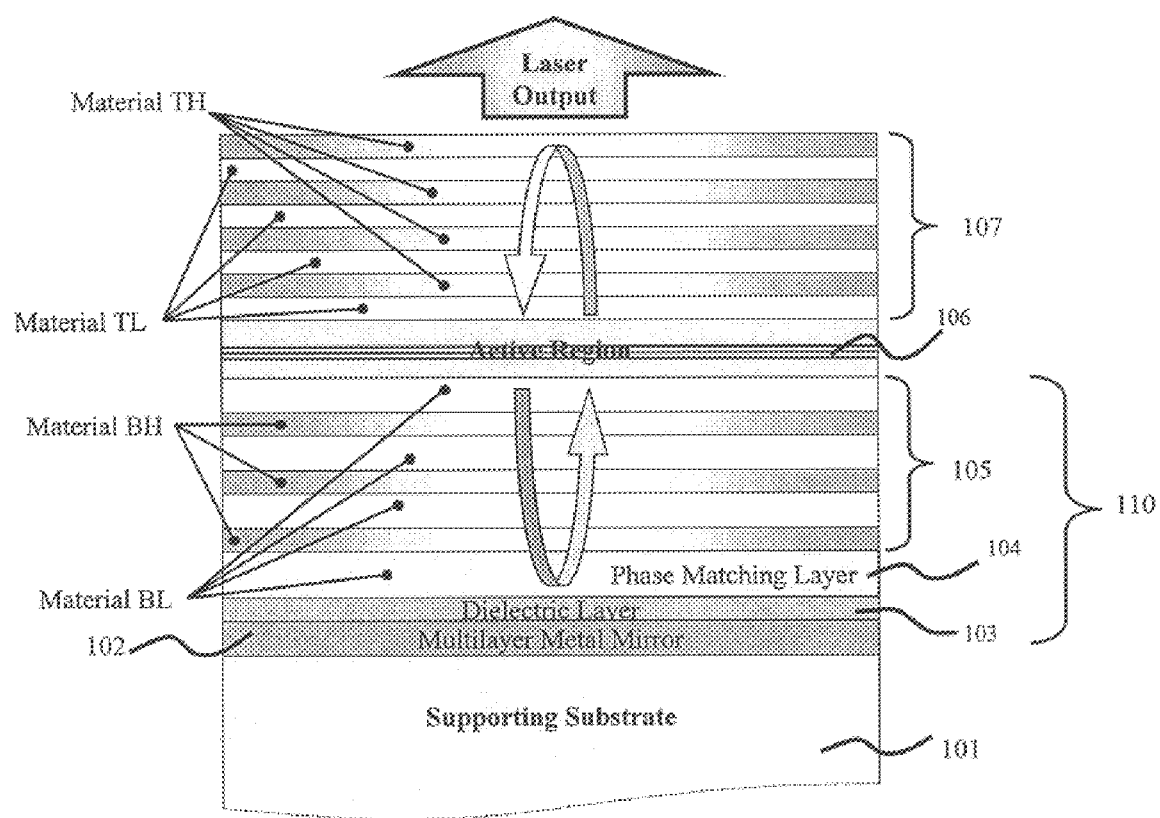
FIG. 1 is a cross-sectional view of the layer structure of a vertical cavity surface emitting laser (VCSEL) device fabricated in accordance with an embodiment of the present invention.

The present invention provides an improved high-reflectance bottom mirror structure of a VCSEL and method for fabricating same. In particular, the present invention provides for a fabrication of a bottom VCSEL mirror comprising a plurality of semiconductor DBR mirror pairs combined with a metal mirror, to provide a composite, high-reflectance bottom cavity mirror. Due to the high reflectance of the metal mirror, a fewer number of semiconductor DBR mirror pairs (i.e., thinner DBR section) need be used in combination with the metal mirror, than are needed in a DBR-only mirror, to provide the desired reflectance (e.g., a reflectance greater than 99.5% or 99.9% may be desired for the bottom cavity mirror of a long wavelength VCSEL). The composite metal mirror/thinner semiconductor DBR provides a high degree of reflectance, but with improved device thermal conductivity, and lower defect density. Because fewer semiconductor DBR mirror pairs are required, in combination with the metal mirror, to provide the desired reflectance for long-wavelength VCSELs, the present invention can be used to provide VCSELs capable of long wavelength emission.

In a conventional VCSEL employing a semiconductor bottom DBR mirror, the bottom DBR is not perfectly reflective. Thus, a small fraction of the laser light from the cavity is transmitted through the bottom DBR, and some of it is then partially reflected back from the backside of the substrate, into the laser cavity. This partially-reflected laser light may cause some degree of laser mode instability, which gives rise to a laser spectrum mode-hopping effect. This mode-hopping effect can be manifested during continuous spectrum tuning of the laser emission wavelength or during continuous wave (cw) operation, and can also generate spectrum noise in the laser output. The metal mirror layer of the present invention advantageously eliminates or greatly mitigates the aforementioned instability, mode-hopping, and noise problems.

The present invention, therefore, provides a method for fabricating a VCSEL having a metal mirror combined with a semiconductor bottom DBR mirror, to achieve the foregoing advantages and others described herein. A long-wavelength VCSEL in accordance with the present invention may employ an InP-based material system, and may be used for a variety of applications. For example, a VCSEL in accordance with the present invention may operate around 1310 nm, or at any of the closely-spaced wavelengths specified by the ITU grid around 1.55 µm, for use in optical fiber telecommunications applications, e.g. for coarse and dense wavelength-division multiplexing (CWDM and DWDM). In the present application, the term long wavelength denotes wavelengths in the infrared spectrum and/or at wavelengths longer than 1 µm, and includes, e.g., optical telecommunications wavelengths such as 1.3 µm to 1.55 µm. The structure, operation, and methods of fabrication of the present invention are described in further detail below with reference to the drawings.

In the present application, the denotations "top" and "bottom" are employed for orientation purposes, to indicate the axial position of a layer within the laser cavity, relative to the active region. E.g., bottom denotes a layer that is (or will be) between the active region and the supporting substrate or submount; top denotes layers on the other side of the active region.

The elements shown in the Figures are not drawn to scale. Referring now to FIG. 1, there is shown a cross-sectional view of the layer structure of a VCSEL 100 fabricated in accordance with an embodiment of the present invention. Epitaxially grown layers of VCSEL 100 may be fabricated with epitaxial growth techniques such as molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. Other layers may be deposited with non-epitaxial deposition techniques such as e-beam evaporation, thermal evaporation, or sputtering.

VCSEL 100 comprises an active region 106 as the optical gain medium, which is sandwiched between top and bottom cavity mirror portions 107, 110, respectively. Active region 106 is thus located within the laser cavity, and is designed to, and has a material that is capable, of stimulated emission at one or more wavelengths of light, including a lasing wavelength (operating frequency). I.e., the active region comprises a population inversion region for producing coherent laser radiation. For example, the optical gain of the active region in a VCSEL may be provided by quantum wells. Each quantum well has a gain spectrum with a single peak wavelength, and some spectral width over which gain is present.

The top and bottom laser cavity mirrors must have sufficient reflectance at the lasing wavelength, given a certain active region gain, to permit lasing to occur. Thus, the DBRs employed are preferably designed with an appropriate layer structure and material system so that they have reflectance bands which include the lasing wavelength. That is, these DBRs typically have a primary reflectance band, which is roughly centered on the lasing wavelength, and/or the reflectance of the DBRs at the lasing wavelength is substantially the maximum reflectance exhibited by the DBR. The reflectance band of the DBR refers to the wavelength band over which the DBR has a reflectance substantially equal to its maximum or peak reflectance, which maximum reflectance is also within the reflectance band and at or near the center wavelength of the reflectance band. In the present application, the term DBR refers to any distributed reflector structure with multiple layers of varying, alternating refractive index giving rise to the desired high-reflectance band required in the VCSEL cavity.

The top cavity mirror comprises, in the embodiment illustrated in FIG. 1, a top DBR 107. Top DBR 107 comprises alternating relatively high and relatively low refractive index layers, i.e. a plurality of mirror pairs. The darker shaded layers denoted "Material TH" indicate the comparatively higher refractive index layers of the top DBR mirror 107 (where TH stands for top-high); and the white layers denoted "Material TL" indicate the comparatively lower refractive index layers of the top DBR mirror 107 (where TL stands for top-low).

The bottom cavity mirror portion 110 comprises a composite DBR/metal mirror, namely semiconductor bottom DBR 105 and multilayer metal mirror 102, and phase-matching layer 104 and dielectric layer 103 which are interposed between the bottom DBR and metal mirror. Bottom DBR 105, like top DBR 107, comprises a plurality of mirror pairs, each mirror pair having a comparatively low and a comparatively high refractive index layer; the entire structure thus comprises alternating relatively high and relatively low refractive index layers. The darker shaded layers denoted "Material BH" indicate the comparatively higher refractive index layers of the bottom DBR mirror 106 (where BH stands for bottom-high); and the white layers denoted "Material BL" indicate the comparatively lower refractive index layers (where BL stands for bottom-low). Top and bottom DBRs 107, 105 may each consist of, for example, a plurality of InP/InGaAsP mirror pairs.

The bottom mirror portion 110 is mounted to supporting substrate 101, which preferably disperses heat transmitted from active region 106 via the bottom mirror portion 110. The composite DBR/metal bottom cavity mirror 110 is high reflectance and also thinner and more thermally conductive than a semiconductor DBR-only mirror of equivalent reflectance would be.

In an embodiment, VCSEL 100 comprises an InGaAsP/InP (or InAlGaAs/InP) based active region 106. Because both DBR mirror structures 107 and 105 are preferably fabricated epitaxially, as described below with reference to FIG. 2, they are preferably composed of semiconductor material mirror pair layers. Thus, in an embodiment, top cavity mirror 107 comprises a top semiconductor DBR, and the bottom cavity mirror 110 comprises a composite bottom semiconductor DBR/metal mirror.

In an embodiment, metal mirror 102 is bonded on a silicon substrate 101, and is the metal mirror layer is formed of a metal such as silver, gold, copper or aluminum, or some layered combination of these and/or other metals. Generally, a metal having a higher electrical conductivity is preferred, because higher conductivity generally correlates with higher optical reflectance. Also, the metal surface of the metal mirror is preferably very smooth and the metal purity is high, to provide for a sufficiently high reflectance mirror. Silver has the best reflectance among all pure metals, and therefore a very smooth, high-purity silver mirror is preferred in an embodiment. The mirror layer thickness may in some embodiments be in a range from about 50 nm to about 100 nm, although thicker or thinner layers may also be emplpoyed, depending on the particular metal and fabrication method used.

If a semiconductor material (e.g., bottom DBR 105 and phase-matching layer 104) were disposed directly on metal mirror 102, the metal of multilayer metal mirror 102 would tend to alloy with the semiconductors of DBR 105/phase-matching layer 104 at the bonding interface. This could lead to the reduction or gradual degradation of the overall reflectance of the composite metal mirror/DBR. Therefore, in an embodiment, an intervening dielectric reaction barrier layer 103 is provided between the metal mirror 102 and adjacent semiconductor materials (e.g., semiconductor DBR stack 105/phase-matching layer 104), to avoid the alloying effect between metals and semiconductors. This reaction barrier layer is preferably composed of organic or inorganic dielectric materials (e.g., $SiO_2$ or $Al_2O_3$), and may have a thickness less than or equal to about one-half of a lasing wavelength. For a DBR and laser structure designed for operation at 1.3 $\mu$m, for example, the thickness would be less than or equal to about 650 nm. In other embodiments, layer 103 may have thicknesses in the range of 100 to 1000 Å.

The reflected light from a metal mirror has a phase shift (e.g., 90°) depending on the properties of the metal mirror layer used. Therefore, it is preferable to have a phase shift adaptive layer in front (i.e., on top) of the metal mirror 102 to adjust the standing wave function, so that reflections from the metal mirror layer and the bottom DBR are phase matched at the lasing wavelength to achieve the maximum overall reflectance. The presence of phase-matching layer 104 thus helps to maximize or improve the overall reflectance of the composite mirror 110. The phase-shift or -matching layer is preferably disposed between the metal mirror layer's reflective surface and the bottom DBR 105.

Phase-matching layer 104 may thus be considered to be part of bottom cavity mirror 110, since it plays a role in the overall reflectance attained by the DBR 105/metal mirror 103 combination. Phase-shift layer 104 may be constructed of epitaxially grown semiconductor materials (e.g., InP), or $SiO_2$ or other suitable dielectric materials, such as $Al_2O_3$ or $\alpha$—Si, and preferably has a suitable thickness and material system to achieve the desired phase matching at a given lasing wavelength, and depending on what material is used for the metal mirror. In some embodiments, a suitable thickness for the phase-matching layer is less than or equal to about one-half of a wavelength of radiation reflected by the DBR. For example, phase-matching layer 104 may be about 980 to 1200 Å. Accordingly, between the bottom DBR 105 and metal mirror 102 of bottom mirror 110 there is provided phase-matching layer 104 (to match the standing wave pattern to the bottom DBR 105) and dielectric reaction barrier layer 103 (to prevent the alloying effect between metal mirror 102 and the semiconductor material of the phase-matching layer 104).

As will be understood, dielectric layer 103 combined with phase-matching layer 104 provide an overall phase matching effect, although phase-matching layer 104 is still regarded and referred to as the phase-matching layer for the VCSEL structure because it has the predominant phase matching effect and is dedicated to this function. Thus, the design of phase-matching layer 104 should take into account the presence of dielectric layer 103. In an alternative embodiment, layers 103 and 104 may be combined into a single layer which provides both phase-matching and reaction barrier functions. In this case, the VCSEL may be said to have a phase-matching layer, and a reaction barrier layer, although the same physical dual-purpose layer performs both functions.

As will be appreciated, the reflectivities of the bottom DBR 105 and metal mirror 102 combine to provide an overall reflectance for the composite bottom cavity mirror 110. In particular, the total reflectance $R_T$ of bottom mirror 110 is a function of the reflectivities $R_M$ and $R_{DBR}$ of metal mirror 102 and bottom DBR 105, respectively, as follows:

$$R_T \; R_{DBR}+((1-R_{DBR}) \cdot R_M) \tag{1}$$

Equation (1) provides only an approximation of the total reflectance $R_T$ of bottom mirror 110, due to interference and other effects, which can be compensated for by use of the phase-matching layer. Thus, an arbitrarily high reflectance total bottom mirror 110 can be achieved, given sufficiently high reflectivities of the metal and bottom DBR mirrors 102, 105, enhanced by the phase-matching properties of reaction barrier layer 103 and phase-matching layer 104.

The higher the reflectance of the metal mirror, the fewer number of DBR pairs will be needed to achieve overall high reflectance of the bottom mirror. Preferably, the reflectance of the metal mirror 102 is sufficiently high so that the number of DBR pairs (of the bottom DBR mirror 105) can be significantly reduced, while maintaining high overall reflectance for composite bottom mirror 110 of greater than some minimum reflectance (e.g., 99% or 99.9%). As noted above, materials such as Ag, Al, Au, and Cu are good examples of metals that may be used to form the metal mirror.

For example, it may be desired to provide a bottom mirror 110 with reflectance of 99%. Given a metal mirror 102 having high enough reflectance $R_M$, only 24 semiconductor DBR mirror pairs in DBR mirror 105 may be required, as opposed to a higher number, such as 40 mirror pairs for a DBR that is not combined with a metal mirror.

It is preferable that the reflecting (i.e., top) side of the metal mirror 102 does not react or alloy with the material that it is in contact with during and after the wafer bonding process. As noted above, the alloying or a chemical reaction at the metal mirror surface would significantly reduce the optical reflectance. Further, the high reflectance metal layer 102 should not alloy with other metal or non-metal layers that are deposited on this high-reflectance metal layer or the metals that are deposited on the substrate to carry out the wafer bonding process.

The mechanical bonding strength of all the layers used in the bonding process, such as the reaction barrier layer 103, the metal mirror layer 102, and the metal bonding layer (described below) should be strong enough to provide acceptable device reliability. For example, gold does not have good mechanical adhesion to many non-metal materials; therefore, it is not desired, in preferred embodiments, to deposit a gold mirror on a reaction barrier layer 103.

Figure 2:
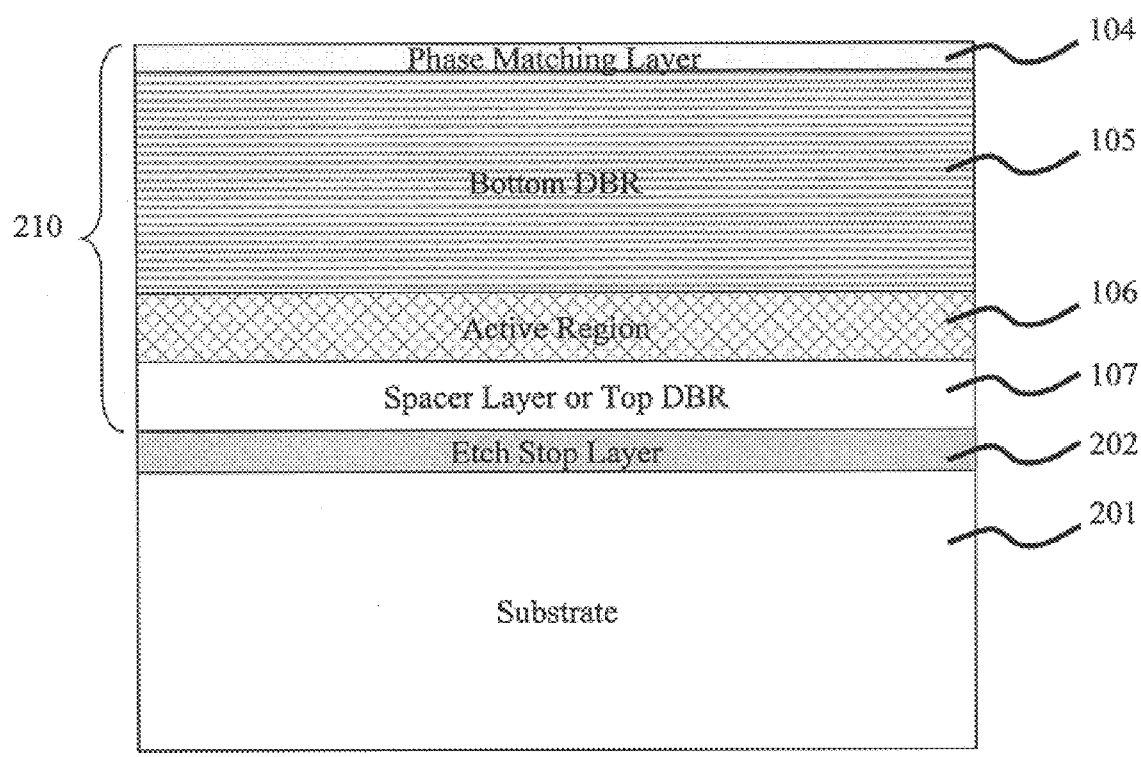
FIGS. 2–3 are cross-sectional illustrations of the layer structures of a part of a fabricated epitaxial wafer used in fabricating a VCSEL in accordance with an embodiment of the present invention.
Figure 3:
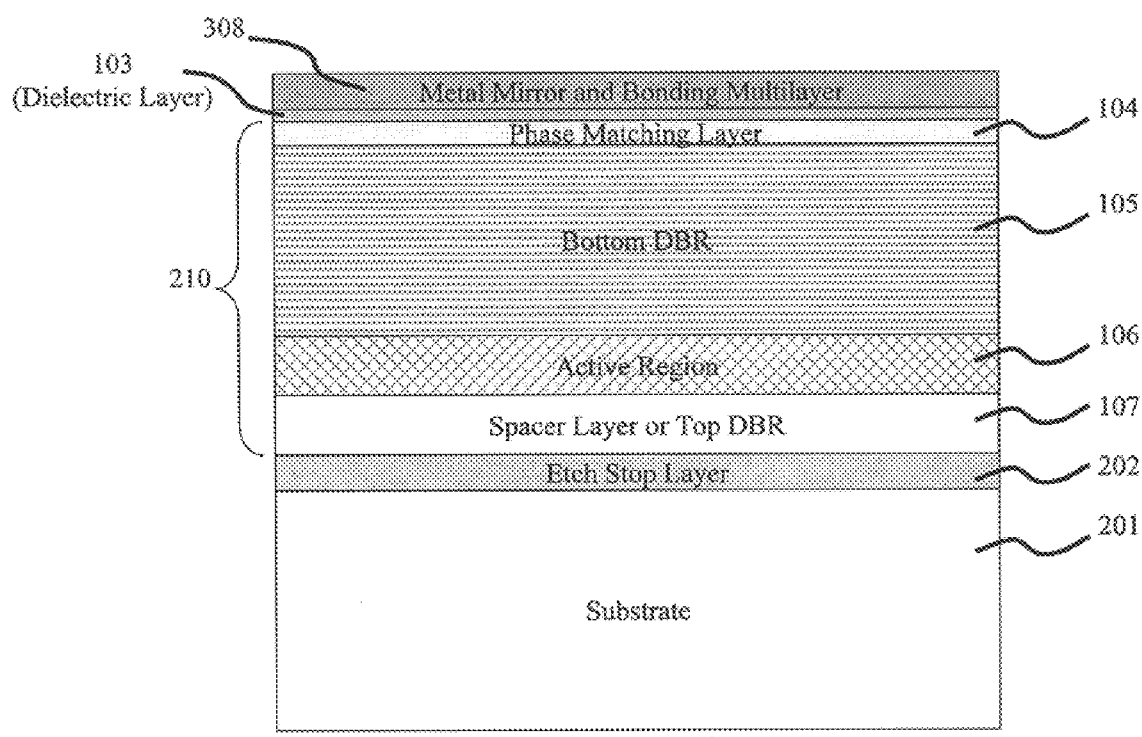
Figure 4:
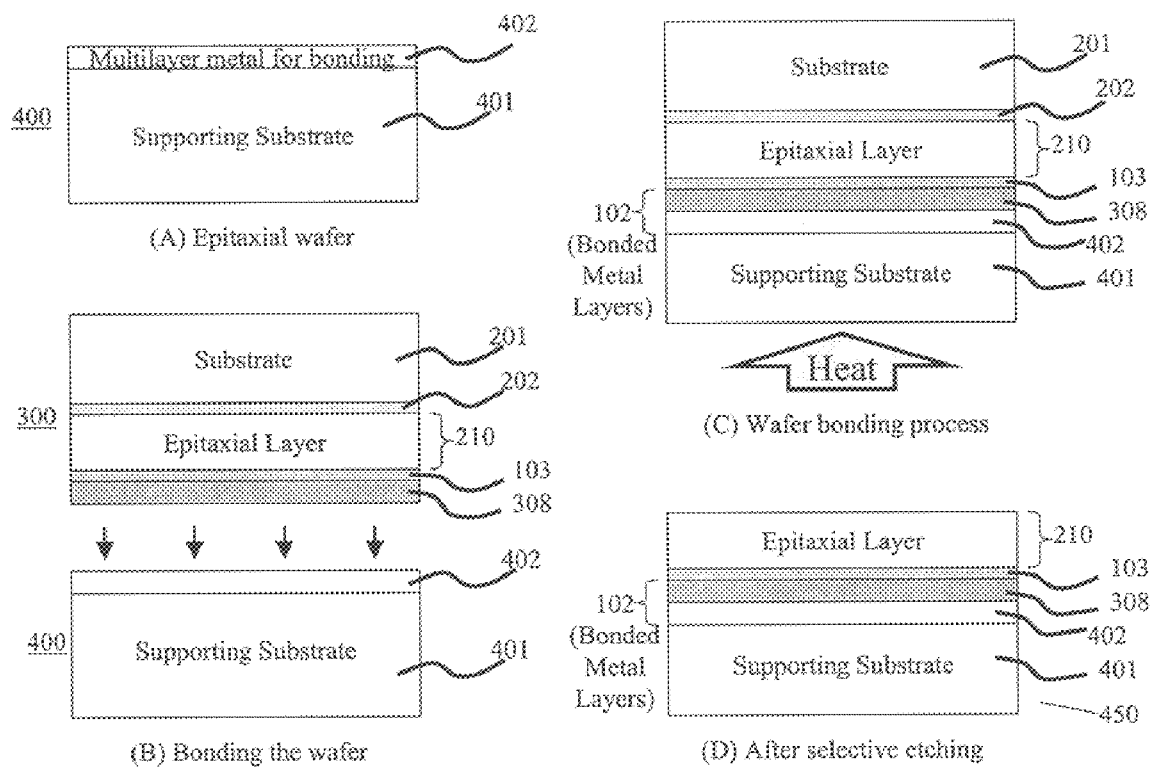
FIGS. 4(A)–(D) are schematic cross-sectional illustrations of a preferred method for fabricating a VCSEL in accordance with the present invention, utilizing the fabricated epitaxial wafer having the layer structure illustrated in FIG. 3, in accordance with the present invention.

FIGS. 2–7 illustrate further fabrication, implementation, and other details of the VCSEL structure 100 of FIG. 1. The same reference numerals used in FIG. 1 are used in FIGS. 2–7, where possible, to denote the same or similar elements, for ease of reference, although some implementation and embodiment details may vary in FIGS. 2–7 from those in FIG. 1 and from one antoher. Referring now to FIGS. 2–4, there are shown schematic cross-sectional illustrations of a preferred method for fabricating a VCSEL in accordance with the present invention.

Referring now to FIG. 2 in particular, there is shown the layer structure of part of a fabricated epitaxial wafer 200 used in fabricating a VCSEL such as VCSEL 100 of the present invention. As shown, various initial layers are epitaxially grown onto an InP substrate 201, including, in the following order: an etch-stop layer 202, a spacer layer/top DBR 107, an active region 106, bottom DBR 105, and phase matching layer 104. Composite layer portion 210 is a combination of layers comprising spacer layer/top DBR 107, active region 106, bottom DBR 105, and phase matching layer 104. Composite layer 210 comprises the layers that will remain after the wafer bonding and selective etching steps described in further detail below with reference to FIGS. 3–4.

Spacer layer/top DBR 107 may either be a spacer layer, in embodiments in which the top cavity mirror will be provided subsequently (e.g., as a deposited dielectric top DBR above spacer layer 107 or an external exit mirror); or a top DBR 107 in embodiments in which the top cavity mirror is provided by a monolithical, epitaxially grown, semiconductor top DBR 107. Various embodiments in this regard are described with reference to FIGS. 5–7.

Referring now to FIG. 3, there is shown the layer structure of epitaxial wafer 300 which results after the deposition of an intervening dielectric reaction barrier layer 103 and a combined metal mirror/bonding multilayer 308 onto wafer 200 of FIG. 2. To fabricate wafer 300, dielectric reaction barrier layer 103 is deposited onto phase matching layer 104 of wafer 200, followed by deposition of the metal mirror/bonding multilayer 308. In some embodiments, multilayer 308 includes a conductive mirror layer as discussed above, and a bonding metal layer formed over the mirror layer. Composition of the bonding metal layer may be chosen to bond at a convenient temperature to a corresponding bonding metal layer on a support substrate, as discussed further below with reference to FIG. 4. For example, relatively low melting temperature metals, such as indium, gold, and zinc, and/or alloys including such metals, may be included in metal mirror/bonding multilayer 308. Metal mirror/bonding multilayer 308 may comprise, for example, a Ti/Pt/Au/In section at its "top" end (in FIG. 3) for bonding with bonding multiplayer 402, and at its "bottom" end, a layer for the metal mirror function, e.g. an aluminum or gold layer. This layer may be, e.g., 300 to 400 Å thick, and is directly in contact with the dielectric reaction barrier layer 103. This metal mirror layer needs to be thick enough so that the alloying of the metal bonding portion does not reduce or significantly impair the reflectivity of the reflective surface of the metal mirror layer.

Metal multilayer 308 may also include a reaction barrier metal layer between the mirror layer and a bonding metal layer, so that reaction between these layers may be reduced and the integrity and reflectance of the mirror layer protected. Suitable reaction barrier metals may include, for example, titanium, platinum, and alloys thereof. In an alternative embodiment, metal mirror/bonding layer 308 may be a single layer as opposed to multiple layers. Preferably, metal multilayer 308 is adapted so that it has the ability to bond with another bonding metal layer, at one side, and leave preserved a highly-reflective metal interface to form the metal mirror, at the other side.

Referring now to FIGS. 4(A)–(D), there are shown schematic cross-sectional illustrations of a preferred method for fabricating a VCSEL in accordance with the present invention, utilizing the fabricated epitaxial wafer 300 shown in FIG. 3. FIG. 4(A) shows an epitaxial supporting (carrier) substrate wafer 400 comprising supporting substrate 401 and a multilayer bonding metal layer 402, which is adapted for bonding with metal mirror/bonding layer 308 of wafer 300. Multilayer metal bonding layer 402 may comprise, e.g., and appropriate alloy such as Ti/Pt/Au/In.

As illustrated in FIG. 4(B), the epitaxial wafer structure 300 shown in FIG. 3 is turned upside down (relative to substrate 400) and mounted to the supporting substrate wafer 400, with metal mirror/bonding multilayer 308 of epitaxial wafer 300 physically contacting metal multilayer 402 of supporting substrate 400.

Next, as shown in FIG. 4(C), heat is applied, causing layers 308 and 402 to bond together to form bonded metal layers 102. As will be understood, the wafer bonding process may cause layers 308 and 402 to alloy together for bonding, or to melt together to bond and form a single bonded layer 102. The heating temperature to carry out the wafer bonding process needs to be low enough so that it will not significantly degrade the semiconductor laser materials. The maximum temperature also depends on how much time is required for the heating process. Typically, for InP based materials, the heating temperature is kept lower than 350° C. without surface protection and lower than 500–600° C. when the surface is protected (which is usually the case in preferred embodiments). Conversely, the melting (or alloying) temperature of the metal bonding layer needs to be high enough to withstand the heat associated with subsequent device processing steps that are necessary to form the VCSEL device. The typical heating temperatures for photolithography ranges from 90° C. to 120° C. Another possible processing temperature is an alloying temperature of around 350° C. for formation of metal contact.

After the wafer bonding step of FIG. 4(C), selective etching is performed to remove InP substrate 201 and etch-stop layer 202, to result in the VCSEL structure 450 illustrated in FIG. 4(D). Depending on the particular etching process used, etch-stop layer 202 may function in different ways. As will be appreciated, the selective etching is, in an embodiment, a two-step process, in which InP substrate material 201 is first etched with an etchant that does not etch layer 202, followed by an etchant that etches away etch stop layer 202 without etching or damaging the epitaxial layers of layer section 210. In another embodiment, etch-stop layer 202 may be a layer which etches rapidly as compared to the substrate 201. In such an embodiment, layer 202 may be preferentially etched away, thereby releasing composite epitaxial layer portion 210 from substrate 201. Such preferential etching may in some embodiments include prior oxidation of layer 202. In either of the above embodiments, etch-stop layer 202 is incorporated into the epitaxial layers of the InGaAsP/InP or InAlGaAs/InP structure to carry out the InP substrate removal process through chemical selective etching procedures without damaging the desired device layers. Several materials may be suitable as an etch-stop layer for an InP substrate, such as InGaAs, InGaAsP, and InGaAlAs.

As will be appreciated, VCSEL structure 450 comprises a substantial number of the functional components of a completed, operational VCSEL, including the metal mirror interface between bonded metal layers 102 and reaction barrier layer 103, which metal mirror has reflectance $R_M$; the reaction barrier layer 103; and the layer portion 210, all supported and mounted on supporting substrate 401. The layer portion 210 includes the phase matching layer 104, bottom DBR 105, and active region 106, as well as a spacer layer/top DBR 107.

There must be a top cavity mirror in order to complete the laser cavity, to form a working laser. In an embodiment, layer 107 is a semiconductor top DBR 107 which provides some or all of the needed reflectance for the top cavity mirror for a VCSEL. The top mirror could be also be provided by an external high-reflectance mirror or a deposited high-reflectance dielectric DBR mirror 103 on top of the bonded layers, in which case layer 107 may be merely a spacer layer (which may also serve current-spreading purposes). If layer 107 is itself a semiconductor top DBR, VCSEL structure 450 comprises the active region 106, sandwiched between top and bottom mirror portions, where the top mirror is the DBR 107, and the bottom mirror is the composite mirror formed by bottom DBR 105 and metal mirror 102 (and including the properties, e.g. of phase matching layer 104). Alternatively, layer 107 is a spacer or cap layer, and a dielectric DBR can be deposited thereon, or an external mirror can be used, as described below with reference to FIGS. 5–7.

Figure 5:
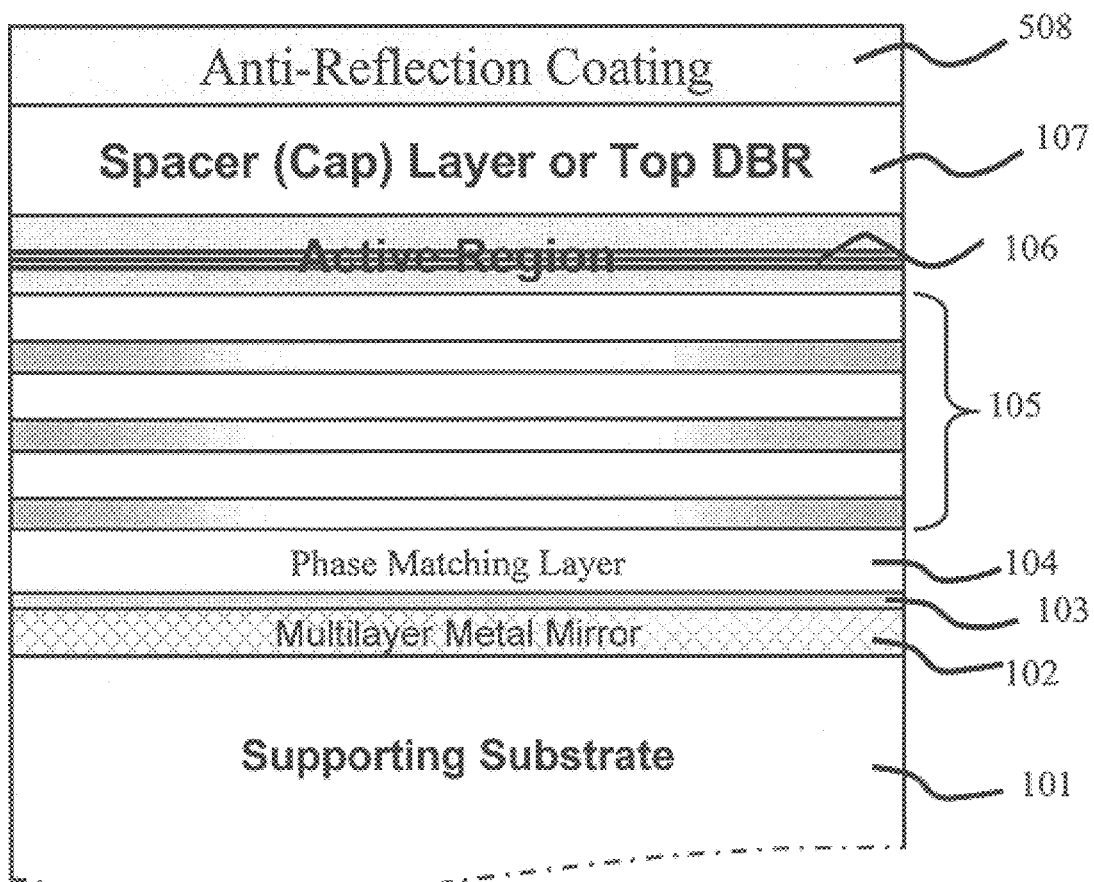
FIG. 5 is a cross-sectional view illustrating the finished layer structure of an optically-pumped VCSEL fabricated in accordance with an embodiment of the present invention.

A VCSEL 450 can be either electrically- or optically-pumped (i.e., EP or OP). In an OP VCSEL, the materials around the active region need not be doped. The main condition for the OP device is that the absorption layer of the active region—which may include quantum wells, barriers, and absorption layers—should have a bandgap smaller than the photon energy of the pump laser. Referring now to FIG. 5, there is shown a cross-sectional view illustrating the finished layer structure of an OP VCSEL 500 fabricated in accordance with an embodiment of the present invention. VCSEL 500 is similar to the basic structure of VCSEL 450 of FIG. 4(D), and comprises a supporting substrate 101, multilayer metal mirror 102 (which may have a reflectance $R_M$ of 95% to 99%, in an embodiment), reaction barrier layer 103, phase matching layer 104, a bottom semiconductor DBR 105, active region 106, semiconductor spacer or "cap" layer 107, and anti-reflection (AR) coating 508. The AR coating or layer 508 need not be applied in a complete device structure. Cap layer 107 may be a mere spacer layer, or may be a top DBR section. Metal mirror 102 and/or its top, reflecting surface (i.e., at the interface between metal mirror multilayer 102 and dielectric layer 103) may be composed, for example, of aluminum, or other metals such as Ag, Au, and Cu (although, as noted above, gold may not be preferred for mechanical adhesion deficiencies).

Figure 6:
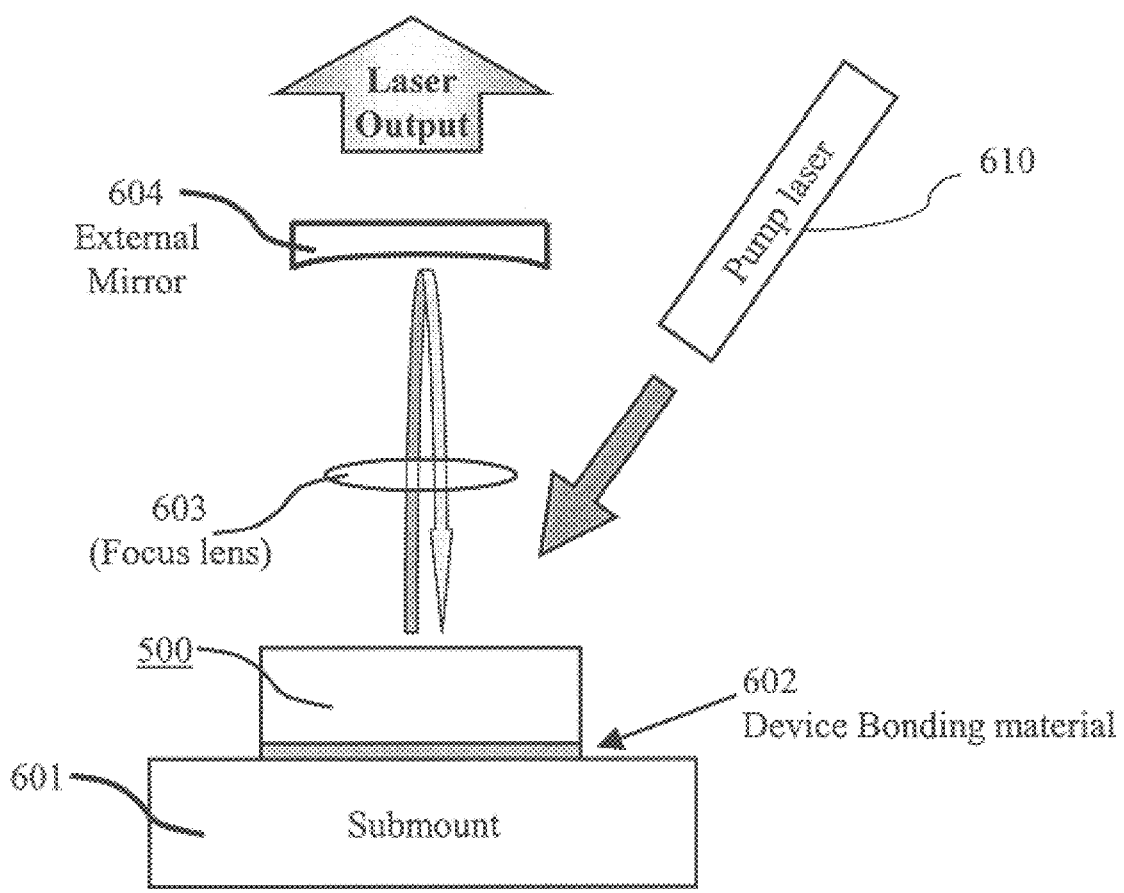
FIG. 6 is a cross-sectional view of an external-cavity optically pumped VCSEL system employing the VCSEL of FIG. 5.

Referring now to FIG. 6, there is shown a cross-sectional view of an external-cavity OP VCSEL system 600 employing the VCSEL 500 of FIG. 5. In this embodiment, VCSEL 500 is bonded by device bonding material 602 to a submount 601. Layer 107 is only a spacer layer, not a semiconductor DBR; external (top) mirror 604 having >99% reflectance is employed to complete the laser cavity. A pump laser 610 is used to excite the electron-hole pairs in active region 106, to produce optical gain. The top or exit mirror is provided by external top mirror 604 and the backside or bottom mirror is provided by the composite metal mirror/DBR 110 to form a laser cavity. Focus lens 603, which is necessary when the cavity length is long, is placed in the path between VCSEL structure 500 and external top mirror 604.

Figure 7:
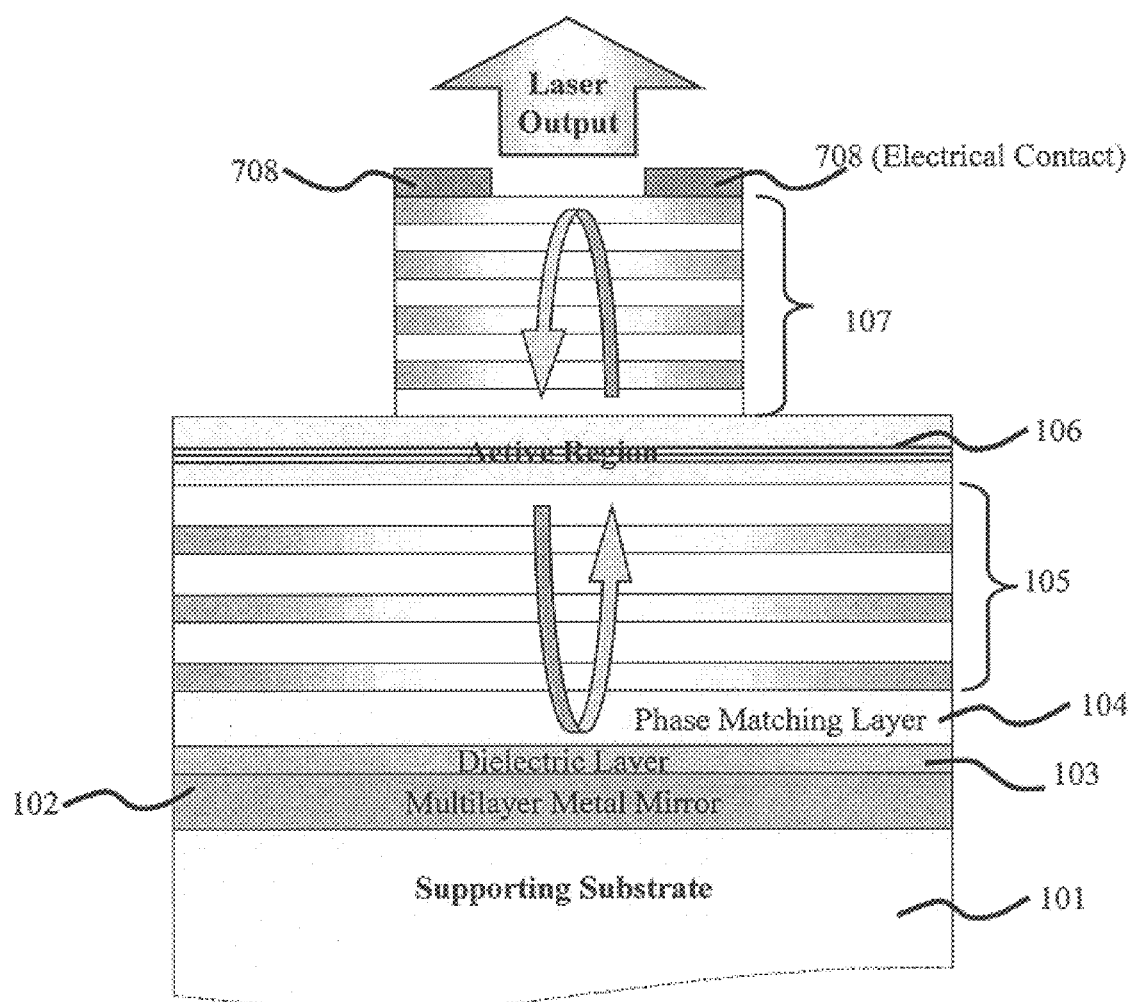
FIG. 7 is a cross-sectional view illustrating the layer structure of an electrically-pumped VCSEL fabricated in accordance with an embodiment of the present invention.

For EP VCSELs, the materials need to be appropriately doped on both sides of the active region to form a p-i-n structure, to form electrical contacts to both the p-doped and n-doped layers for carrier injection, and to form a current confinement structure to limit the injected current to the desired laser device area. Referring now to FIG. 7, there is shown a cross-sectional view illustrating the layer structure of an EP VCSEL 700 fabricated in accordance with an embodiment of the present invention. VCSEL 700 is similar to the basic structure of VCSEL 450 of FIG. 4(D), and comprises a supporting (carrier) substrate 101, multilayer metal mirror 102, reaction barrier layer 103, phase matching layer 104, bottom DBR portion 105, active region 106, top DBR 107, and electrical contact 708. The layers of VCSEL 700 are suitably doped so as to permit electrical pumping.

Top DBR section 107 is composed of semiconductor material layers (which may be doped and conduct pumping current), and serves as a current confinement or spreading section. In the embodiment illustrated, it has been patterned (e.g., by selective etching or lift-off processes) to have a mesa shape for current confinement.

In an alternative embodiment, top DBR 107 provides only part of the total reflectance required for the top (exit) cavity mirror; in this case, a further top mirror is disposed on top of top DBR 107, to add more reflectance. The further top mirror could be, for example, an external high-reflectance mirror, or a deposited high-reflectance dielectric DBR mirror on top of the laser structure formed by the bonding process. Thus, in an embodiment, a further DBR stack (not shown) formed of dielectric material may be deposited on top of top DBR stack 107, between electrical contacts 708. Thus, in this alternative embodiment, the top cavity mirror may be a combination of semiconductor DBR 107 and a dielectric DBR. In another embodiment, layer 107 is not a DBR but is merely an epitaxial spacer layer (as described with reference to FIGS. 2, 3 and 5), in which case a later-deposited dielectric DBR (integrated or external) may be used to provide the top cavity mirror for the VCSEL.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A vertical-cavity surface-emitting laser (VCSEL) structure comprising:
    a metal mirror layer disposed on a supporting substrate;
    a dielectric reaction barrier layer disposed on the top of the metal mirror layer;
    a semiconductor phase-matching layer disposed the top of the dielectric reaction barrier layer;
    a semiconductor bottom DBR disposed on the top of the phase-matching layer the bottom DBR and metal mirror layer forming a composite metal and dielectric DBR bottom cavity mirror having a reflectance band including a lasing wavelength, wherein the dielectric reaction barrier layer reduces reaction between the metal mirror layer and the semiconductor phase-matching layer and the phase-matching layer is for adjusting the standing wave so that reflections from the metal mirror layer and the bottom DBR are phase matched at the lasing wavelength; and
    a semiconductor active region disposed on the top of the bottom DBR, said active region capable of stimulated emission at the lasing wavelength.

2. The VCSEL structure of claim 1, wherein the thickness of the reaction barrier layer is less than or equal to about one-half of the lasing wavelength.

3. The VCSEL structure of claim 1, further comprising a top cavity mirror disposed above the active region to form a cavity in conjunction with the bottom cavity mirror, said top cavity mirror having a reflectance band including the lasing wavelength.

4. The VCSEL structure of claim 3, wherein said top cavity mirror has lower reflectance than said bottom cavity mirror, whereby said top cavity mirror is an exit mirror.

5. The VCSEL structure of claim 3, wherein the top cavity mirror comprises a semiconductor top DBR disposed on an opposite side of said active region from said bottom DBR.

6. The VCSEL structure of claim 5, wherein the top cavity mirror further comprises a dielectric DBR disposed on top of the semiconductor top DBR.

7. The VCSEL structure of claim 3, wherein the top cavity mirror comprises an external mirror.

8. The VCSEL structure of claim 7, further comprising a focus lens interposed between the active region and the external mirror.

9. The VCSEL structure of claim 1, wherein said lasing wavelength is greater than 1 micron.

10. The VCSEL structure of claim 1, wherein said lasing wavelength is within a range from about 1.3 micron to about 1.6 micron.

11. The VCSEL structure of claim 1, wherein said substrate consists of silicon.

12. The VCSEL structure of claim 1, wherein the metal mirror layer comprises a layer of high-conductivity metal.

13. The VCSEL structure of claim 12, wherein:
    the metal mirror layer comprises silver; and
    the metal mirror layer comprises a metal bonding multilayer adapted for metal bonding and disposed between said layer of high-conductivity metal and said supporting substrate.

14. The VCSEL structure of claim 13, wherein the metal bonding multilayer comprises at least one of indium, gold and zinc.

15. The VCSEL structure of claim 1, wherein the reaction barrier layer consists of one of titanium and platinum.

16. The VCSEL structure of claim 1, wherein the thickness of said base matching layer is less than or equal to about one-half of the lasing wavelength.

17. The VCSEL structure of claim 1, wherein the active region comprises indium gallium arsenide phosphide or indium aluminum gallium arsenide.

18. The VCSEL structure of claim 1, wherein said bottom DBR comprises a plurality of InP/InGaAsP mirror pairs, each mirror pair having a pair of layers, each layer of said bottom DBR having approximately a quarter-wavelength optical thickness at the lasing wavelength.

* * * * *